United States Patent
Konishi

(10) Patent No.: US 6,861,899 B2
(45) Date of Patent: Mar. 1, 2005

(54) SIGNAL TRANSMISSION CIRCUIT AND ELECTRONIC EQUIPMENT

(75) Inventor: Takanori Konishi, Kobe (JP)

(73) Assignee: Fujitsu Ten Limited, Hyogo (JP)

( * ) Notice: Subject to any disclaimer, the term of this patent is extended or adjusted under 35 U.S.C. 154(b) by 0 days.

(21) Appl. No.: 10/657,178

(22) Filed: Sep. 9, 2003

(65) Prior Publication Data

US 2004/0095200 A1 May 20, 2004

(30) Foreign Application Priority Data

Sep. 9, 2002 (JP) .................................... P2002-262955

(51) Int. Cl.⁷ ............................................. H01L 25/00
(52) U.S. Cl. ...................................... 327/565; 361/738
(58) Field of Search ................................ 327/564, 565, 327/566; 361/718, 719, 720, 736, 738

(56) References Cited

U.S. PATENT DOCUMENTS 5,978,231 A * 11/1999 Tohya et al. ................. 361/782

FOREIGN PATENT DOCUMENTS

| JP | 5-4590 | 1/1993 |
|---|---|---|
| JP | 5-235679 | 9/1993 |
| JP | 6-196836 | 7/1994 |
| JP | 7-66519 | 3/1995 |
| JP | 7-202374 | 8/1995 |
| JP | 9-298368 | 11/1997 |
| JP | 10-233562 | 9/1998 |
| JP | 11-26907 | 1/1999 |

OTHER PUBLICATIONS

Kenichi Ito, "Earth and Static Electricity", The Nikkan Kogyo Shimbun, Ltd., Jun. 30, 1980, pp. 2 and 67.

* cited by examiner

Primary Examiner—My-Trang Nu Ton
(74) Attorney, Agent, or Firm—Wenderoth, Lind & Ponack, L.L.P.

(57) ABSTRACT

The respective ends of input wiring on a printed wiring board of a signal transmission circuit are connected to an input terminal section and a transistor. One terminal of a first capacitor and a first resistor are respectively connected to the input wiring. A leading-side transmission path from a connection point with the first capacitor to a connection point with the input terminal section is formed by only a conductive pattern. An intermediate transmission path from the connection point with the first capacitor to a connection point with the first resistor includes two or more through holes or via holes. The intermediate transmission path is placed near grounding wiring on the printed wiring board. When one terminal of a second capacitor is connected to the intermediate transmission path, a transmission path between the respective connection points with the two capacitors includes one or more through holes or via holes.

10 Claims, 9 Drawing Sheets

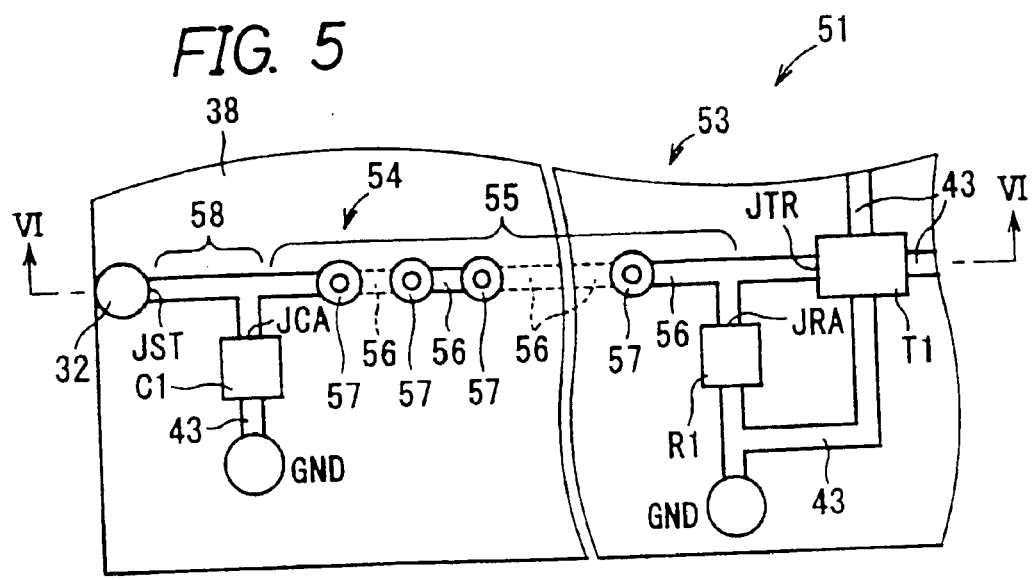
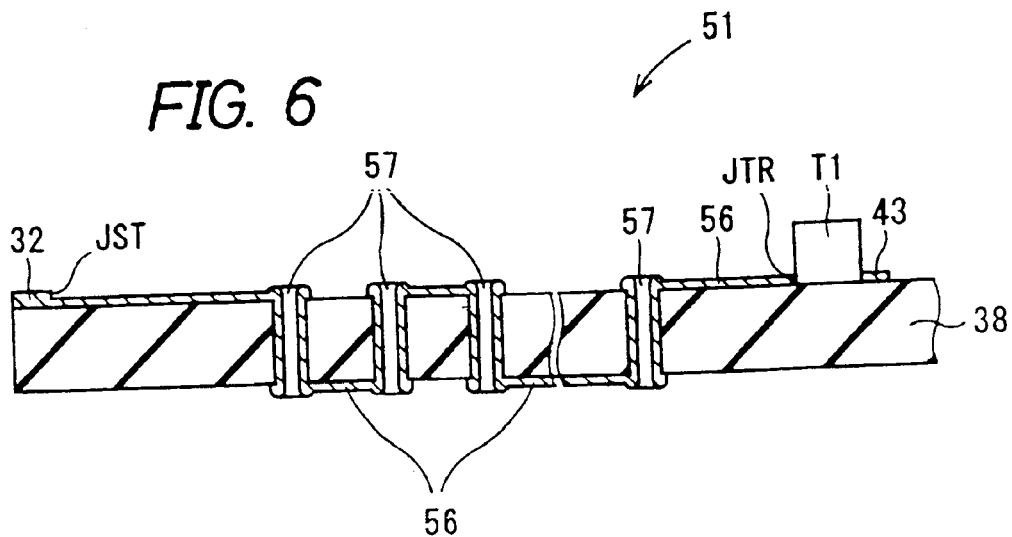

SIGNAL TRANSMISSION CIRCUIT AND ELECTRONIC EQUIPMENT

BACKGROUND OF THE INVENTION

1. Field of the Invention

The present invention relates to a signal transmission circuit for transmitting signals from an input terminal section to a processing circuit section, and an electronic equipment (device) provided with the signal transmission circuit.

2. Description of the Related Art

In related art electronic equipment, a signal transmission circuit for transmitting signals to a processing circuit section for signal processing is provided with a circuit for eliminating noise components of signals given from the outside of the electronic equipment to the electronic equipment (see, for example, Kenichi Ito, "Earth and Static Electricity", THE NIKKAN KOGYO SHIMBUN, LTD., Jun. 30, 1980, pages 2 and 67). The noise component elimination circuit is realized by, for example, a low-pass filter constituted by a capacitor and a resistor. The noise component elimination circuit is placed right near an external terminal section.

Further, in another related art circuit board that has a constitution for increasing a noise elimination capability of a noise eliminating filter, at least one of a plurality of ground patterns for grounding is used as a ground pattern for the noise eliminating filter, and a grounding section of a circuit device right near a noise source in the noise eliminating filter is connected to the ground pattern for the noise eliminating filter (see, for example, Japanese Unexamined Patent Publication JP-A 5-235679 (1993)).

In still another related art noise component eliminating circuit in which a bypass capacitor is used, connecting the bypass capacitor in parallel between a power source line and a grounding line to which a noise source is connected is commonly known.

In still another related art control equipment in which at least two circuit boards, on each of which a circuit device is mounted, are placed substantially parallel, as a structure for eliminating noise, in the case where the two circuit boards are connected by the use of a connection jumper. A signal line which is apt to be affected by noise of a plurality of signal lines in the connection jumper is made of metal which has a specified resistance value higher than the resistance values of the other signal lines (see, for example, Japanese Unexamined Utility Model Publication JP-U 5-4590 (1993)).

In still another related art, a circuit for eliminating noise components using a constitution part in a printed circuit as a circuit device is proposed (see, for example, Japanese Unexamined Patent Publications JP-A 9-298368 (1997), JP-A 11-26907 (1999), JP-A 6-196836 (1994), JP-A 7-202374 (1995), JP-A 7-66519 (1995), JP-A 10-233562 (1998)).

In a ceramic wiring board of JP-A 9-298368, a via hole of an internal layer of the board formed by the use of a resistive element whose major component is $RuO_2$ is used as a resistor. In a printed wiring board of JP-A 11-26907, via holes for connecting conductor patterns that exist in mutually different layers of the printed wiring board are formed so that each hole has a resistance value of 1 Ω or more, and the via holes are used as resistors.

In a memory module of JP-A 6-196836, a chip capacitor for cutting noise is realized by a printed part. The chip capacitor realized by a printed part is preformed by the use of a printing technique on one face of a board to which a memory is to be mounted. In a printed board of JP-A 7-202374, a capacitor as a capacitive element provided in a noise eliminating circuit and a coil as an inductive component provided in the noise eliminating circuit are realized by printed parts. The capacitor realized by a printed part is constituted by conductive patterns that are formed on both faces of a board so as to face each other via the board. In order to realize the coil by a printed part, a plurality of linear conductive patterns formed on both the faces of the board, respectively, are connected in series alternately via through holes so as to become one spiral conductive path on the whole.

In a flexible board of JP-A 7-66519, a trap filter part constituted by a pair of coils and one capacitor is formed by using a reactance component and a parasitic capacitance of a conductive pattern as a signal line on the flexible board. In a printed board of JP-A 10-233562, an LC noise filter that includes a capacitor and an inductor is formed as a printed circuit device. Therefore, the printed board has a constitution that signal transmitting wiring having a zigzag portion is placed on one face of the board, grounding wiring is placed on the other face of the board, and through holes are connected to the zigzag portion of the signal transmitting wiring and the grounding wiring, respectively. The through hole of the zigzag portion of the signal transmitting wiring and the through hole of the grounding wiring constitute the capacitor. The zigzag portion of the signal transmitting wiring constitutes the inductor.

FIG. 12 is a plan view of a signal transmission circuit 3 of a related art that comprises a capacitor 1 for eliminating noise components and uses a printed wiring board 2. This signal transmission circuit 3 is a circuit for transmitting signals from the outside of electronic equipment from an input terminal section to a processing circuit section. The signal transmission circuit 3 comprises a transistor 4, a first resistor 5 and a second resistor 6 as constitution parts which relate to signal transmission, other than the capacitor 1 and the printed wiring board 2. The printed wiring board 2 includes input wiring 7 connected to the input terminal section, output wiring 8 connected to the processing circuit section, and an insulation board 9 on which the input wiring 7 and the output wiring 8 are formed.

A base terminal of the transistor 4 is connected to the input wiring 7. An emitter terminal of the transistor 4 is grounded. A collector terminal of the transistor 4 is connected to the output wiring 8. The first resistor 5 is connected in parallel between the input wiring 7 and the emitter terminal of the transistor 4. One terminal of the capacitor 1 is connected to the input wiring 7. The other terminal of the capacitor 1 is grounded. To the collector terminal of the transistor 4, a predetermined reference voltage is supplied via the second resistor 6.

At the time of designing the signal transmission circuit 3 of the related art shown in FIG. 12, a constitution that relates to signal transmission of the signal transmission circuit 3 is determined firstly, and the noise component eliminating capacitor 1 is added after that. Therefore, usually, the transistor 4, the first resistor 5 and the second resistor 6 are mounted on a surface of the printed wiring board 2 on which parts are mounted, and the noise component eliminating capacitor 1 is mounted on a backside surface of the printed wiring board which is soldered. In this case, the input wiring 7 has a constitution that conductive patterns 11, 12 disposed to both the faces of the board 9, respectively, and are electrically connected by a via hole 13.

Since the via hole 13 has a larger resistance value than the conductive patterns, in a case where the via hole 13 exists on a first transmission path 16 from a connection point 14 with the input terminal section to a connection point 15 with the capacitor 1 in the input wiring 7, a resistance component of the first transmission path 16 acts as a resistor interposed between the input terminal section and the capacitor 1. Consequently, there is a possibility that the capacitor 1 does not function effectively for eliminating noise components.

Further, in the signal transmission circuit 3 of the related art, a second transmission path 18 from a connection point 15 with the capacitor 1 and a connection point 17 with the base terminal of the transistor 4 in the input wiring 7 is usually formed only by one via hole and two conductive patterns. In this case, a resistance component of the second transmission path 18 is lower than a resistance component of a resistor used for eliminating noise components. Thus, in the signal transmission circuit 3 of the related art, a constitution of using the resistance component of the second transmission path 18 for eliminating noise components in signals is not considered.

SUMMARY OF THE INVENTION

An object of the invention is to provide a signal transmission circuit for eliminating noise components superposed on signals and electronic equipment that comprises the signal transmission circuit, without adding a part for eliminating noise components in signals, by using a constitution of a printed wiring board, and to provide an electronic equipment including the signal transmission circuit.

The invention provides a signal transmission circuit for transmitting signals from an input terminal section to which the signals are inputted, to a processing circuit section in which the signals are processed, the signal transmission circuit comprising:

a printed wiring board including input wiring connected to the input terminal section and an insulation board on which the input wiring is formed; and a first capacitor, one terminal of which is connected to the input wiring, a connection point between the first capacitor and the input wiring being closer to a connection point between the input terminal section and the input wiring than a connection point between the processing circuit section and the input wiring, and a portion of the input wiring extending from the connection point with the first capacitor to the connection point with the input terminal section being formed by only a conductive pattern.

According to the invention, in the signal transmission circuit, a signal transmission path between the capacitor for eliminating noise components of signals and the input terminal section is constituted by only a conductive pattern. Consequently, the capacitor for eliminating noise components effectively functions, so that it is possible to sufficiently eliminate noise components from signals transmitted in the signal transmission circuit.

The invention provides a signal transmission circuit for transmitting signals from an input terminal section to which the signals are inputted, to a processing circuit section in which the signals are processed, the signal transmission circuit comprising:

a printed wiring board including input wiring connected to the input terminal section and an insulation board on which the input wiring is formed;

a transistor having a base terminal which is connected to the input wiring, an emitter terminal which is grounded, and a collector terminal which is connected to the processing circuit section;

a reference voltage source for supplying a predetermined reference voltage to the collector terminal of the transistor;

a resistor which is connected in parallel between the input wiring and the base terminal of the transistor, and the emitter terminal of the transistor; and a first capacitor, one terminal of which is connected to the input wiring, a portion of the input wiring extending from a connection point with the first capacitor to a connection point with the resistor including three or more conductive patterns which are respectively placed on both faces of the board and two or more through holes or via holes which connect the conductive patterns placed on both the faces of the board.

According to the invention, in the signal transmission circuit, in a signal transmission path between the capacitor for eliminating noise components of signals and the transistor for signal transmission, two or more via holes or through holes are included. Consequently, not only the capacitor but also the transmission path from the capacitor to the transistor serves for eliminating noise, so that it is possible to sufficiently eliminate noise components from signals transmitted in the signal transmission circuit.

The invention provides a signal transmission circuit for transmitting signals from an input terminal section to which the signals are inputted, to a processing circuit section in which the signals are processed, the signal transmission circuit comprising:

a printed wiring board including input wiring connected to the input terminal section, wiring for grounding, and an insulation board on which the input wiring and the grounding wiring are formed;

a transistor having a base terminal which is connected to the input wiring, an emitter terminal which is connected to the grounding wiring, and a collector terminal which is connected to the processing circuit section;

a reference voltage source for supplying a predetermined reference voltage to the collector terminal of the transistor;

a resistor which is connected in parallel between the input wiring and the base terminal of the transistor, and the emitter terminal of the transistor; and a first capacitor, one terminal of which is connected to the input wiring, a portion of the input wiring extending from a connection point with the first capacitor to a connection point with the resistor being placed in a vicinity of the grounding wiring, and a parasitic capacitance being generated between the portion and the grounding wiring.

According to the invention, in the signal transmission circuit, a signal transmission path between the capacitor for eliminating noise components of signals and the transistor for signal transmission is placed in the vicinity of the grounding wiring. Consequently, the transmission path between the capacitor and the transistor and the grounding wiring function as a capacitor for eliminating noise components, so that noise components are sufficiently eliminated from signals transmitted in the signal transmission circuit.

The invention provides a signal transmission circuit for transmitting signals from an input terminal section to which the signals are inputted, to a processing circuit section in which the signals are processed, the signal transmission circuit comprising:

a printed wiring board including input wiring connected to the input terminal section and an insulation board on which the input wiring is formed;

a transistor having a base terminal which is connected to the input wiring, an emitter terminal which is grounded, and a collector terminal which is connected to the processing circuit section;

a reference voltage source for supplying a predetermined reference voltage to the collector terminal of the transistor;

a resistor which is connected in parallel between the input wiring and the base terminal of the transistor, and the emitter terminal of the transistor;

a first capacitor, one terminal of which is connected to the input wiring; and a second capacitor, one terminal of which is connected to a portion of the input wiring extending from a connection point with the first capacitor to a connection point with the resistor, a connection point between the second capacitor and the input wiring being closer to a connection point between the transistor and the input wiring than the connection point between the first capacitor and the input wiring, and a portion of the input wiring extending from the connection point with the first capacitor to the connection point with the second capacitor including two or more conductive patterns which are respectively placed on both faces of a board and one or more through holes or via holes which connect the conductive patterns placed on both of the faces of the board.

According to the invention, in the signal transmission circuit, in a signal transmission path between the two capacitors for eliminating noise components of signals, one or more via holes or through holes are included. Consequently, not only the two capacitors but also the transmission path between the capacitors serves for eliminating noise, so that it is possible to further sufficiently eliminate noise components from signals transmitted in the signal transmission circuit.

The invention provides an electronic equipment comprising:

an input terminal section to which a signal is inputted;

a processing circuit section in which a signal is processed; and the aforementioned signal transmission circuit that connects the input terminal section and the processing circuit section.

According to the invention, the electronic equipment comprises the aforementioned signal transmission circuit. Consequently, noise components of signals given from the input terminal section to a signal processing section via the signal transmission circuit are sufficiently eliminated. Therefore, an influence of noise components on signal processing in the signal processing section is sufficiently suppressed.

As described above, according to the invention, the signal transmission circuit is interposed between the input terminal section and the processing circuit section, and at least the first capacitor is connected to the input wiring from the input terminal section to the base terminal of the transistor. In the input wiring, a leading-side transmission path between the first capacitor and the input terminal section is constituted by only a conductive pattern. Moreover, according to the invention, the resistor is further connected to the input wiring. In an intermediate transmission path from the connection point with the first capacitor to the connection point with the resistor in the input wiring, two or more via holes or through holes are included. Further, according to the invention, the intermediate transmission path is placed in the vicinity of the grounding wiring. Furthermore, according to the invention, the second capacitor is further connected to the intermediate transmission path of the input wiring, and one or more via holes or through holes are included in a portion of the input wiring between the two capacitors. On the basis of the above reasons, it is possible to further sufficiently eliminate noise components from signals transmitted in the signal transmission circuit. Besides, according to the invention, the electronic equipment comprises the aforementioned signal transmission circuit. Consequently, an influence of noise components on signal processing in the signal processing section is sufficiently suppressed.

BRIEF DESCRIPTION OF THE DRAWINGS

Other and further objects, features, and advantages of the invention will be more explicit from the following detailed description taken with reference to the drawings wherein:

FIG. 5 is a plan view of a signal transmission circuit, which is a second embodiment of the invention;

FIG. 6 is a sectional view taken on cross-sectional line VI—VI of FIG. 5;

DETAILED DESCRIPTION OF THE PREFERRED EMBODIMENTS

Figure 1:
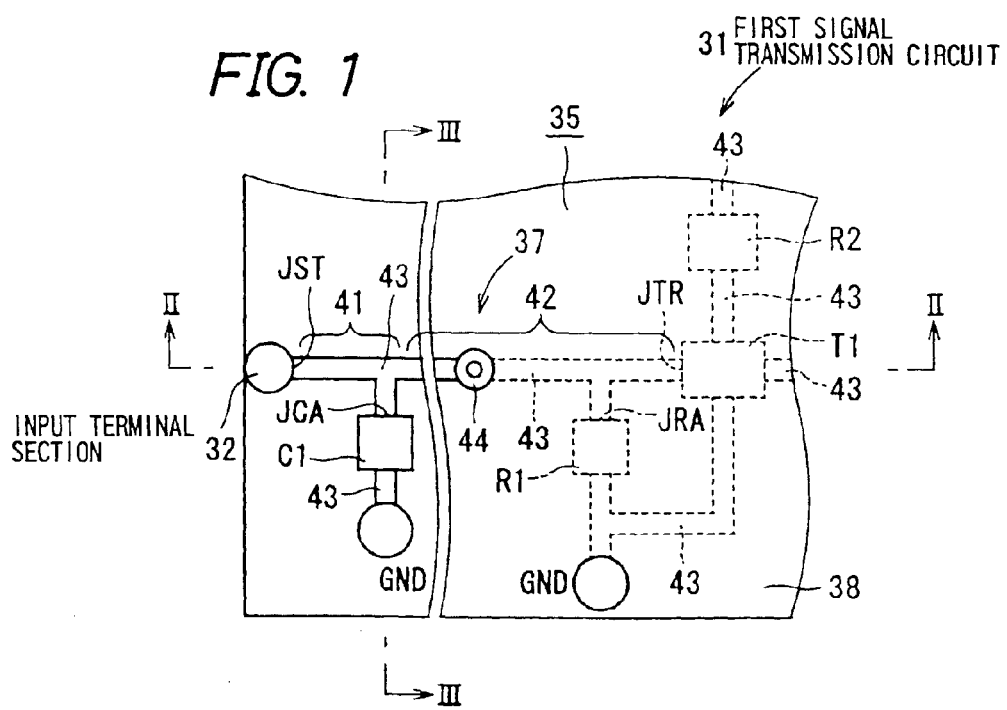
FIG. 1 is a plan view of part of a signal transmission circuit, which is a first embodiment of the present invention.

Now referring to the drawings, preferred embodiments of the invention are described below.

Figure 2:
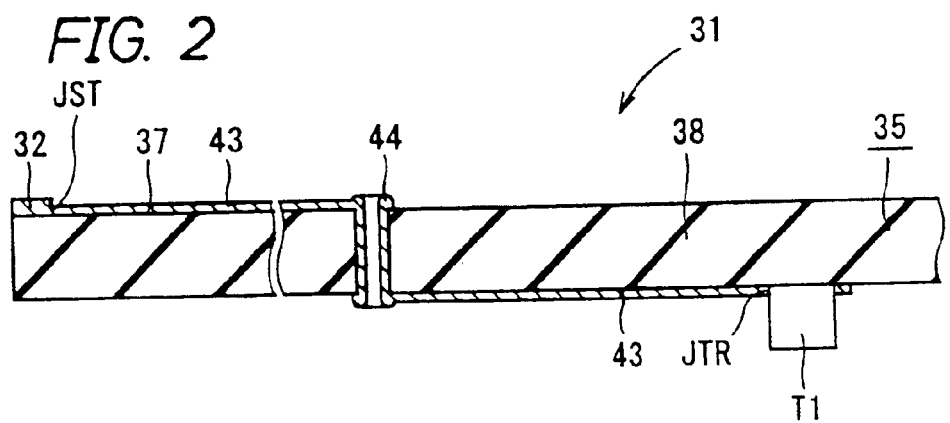
FIG. 2 is a sectional view taken on cross-sectional line II—II of FIG. 1.
Figure 3:
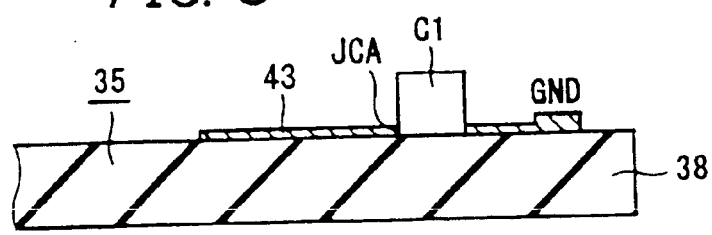
FIG. 3 is a sectional view taken on cross-sectional line III—III of FIG. 1.
Figure 4:
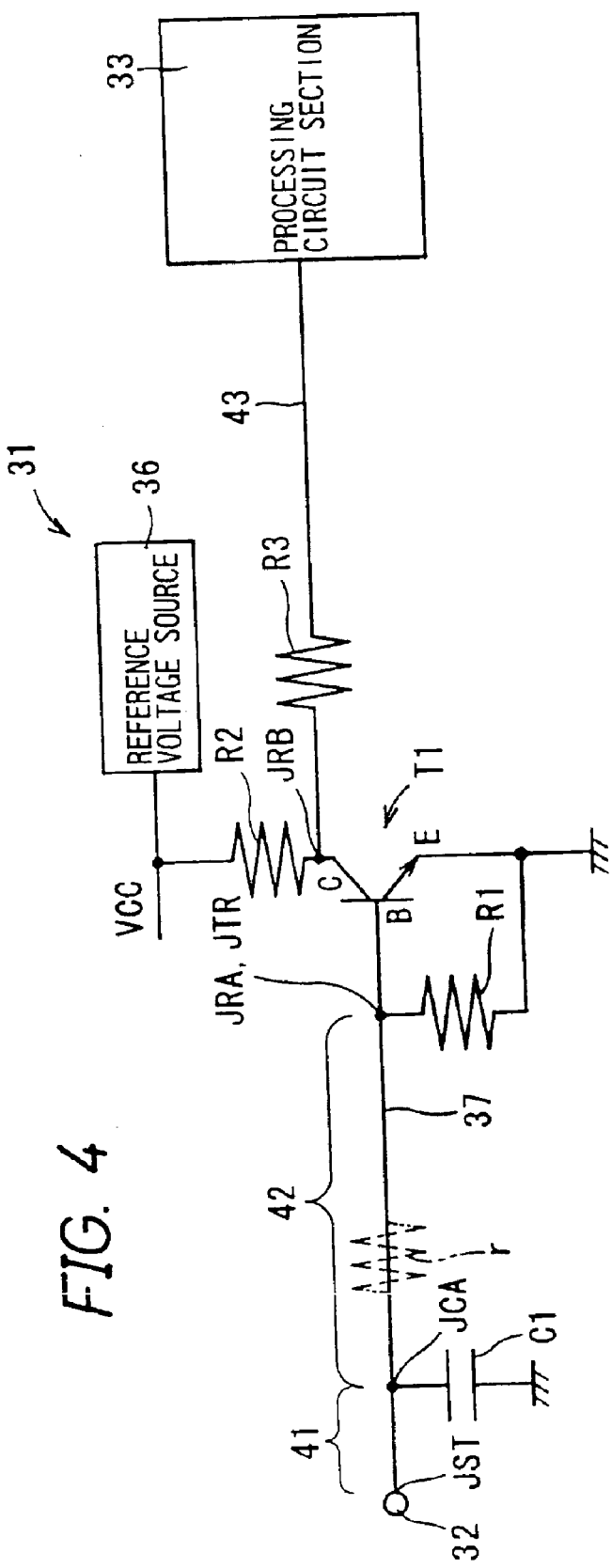
FIG. 4 is an equivalent circuit view of the signal transmission circuit of FIG. 1.

FIG. 1 is a plan view of a signal transmission circuit 31 (referred to as 'a first signal transmission circuit' hereafter), which is a first embodiment of the present invention, FIG. 2 is a sectional view taken on cross-sectional line II—II of FIG. 1, FIG. 3 is a sectional view taken on cross-sectional line III—III of FIG. 1, and FIG. 4 is an equivalent circuit view of the first signal transmission circuit of FIG. 1. FIGS. 1 to 4 will be described together. The first signal transmission circuit 31 is, in electronic equipment, a circuit for transmitting signals from an input terminal section 32 to which the signals are inputted to a processing circuit section 33 in which the signals are processed. Moreover, the first signal transmission circuit 31 has a constitution for eliminating noise components of signals.

The first signal transmission circuit 31 comprises a printed wiring board 35, a transistor T1, a reference voltage source 36, a first resistor R1, a second resistor R2, a third resistor R3, and a first capacitor C1. The printed wiring board 35 includes input wiring 37 connected to the input terminal section 32, and an insulation board 38 on which the input wiring 37 is formed.

A base terminal of the transistor T1 is connected to the input wiring 37. An emitter terminal of the transistor T1 is grounded. The first resistor R1 is connected in parallel between the input wiring 37 and the base terminal of the transistor T1, and the emitter terminal of the transistor T1. The reference voltage source 36 supplies a predetermined reference voltage to a collector terminal of the transistor T1 via the second resistor R2. The collector terminal of the transistor T1 is connected to the processing circuit section 33 via the third resistor R3.

One terminal of the first capacitor C1 is connected to the input wiring 37. The other terminal of the first capacitor C1 is grounded. A connection point JCA between the first capacitor C1 and the input wiring 37 is closer to a connection point JST between the input terminal section 32 and the input wiring 37 than a connection point JTR between the transistor T1 and the input wiring 37.

In the first signal transmission circuit 31, the second resistor R2 and the third resistor R3 are connected in series. A serial resistance circuit constituted by the second resistor R2 and the third resistor R3 is interposed between the reference voltage source 36 and the processing circuit section 33. A connection point JRB between the second resistor R2 and the third resistor R3 is grounded via the transistor T1. The transistor T1 functions as a switching device that opens and closes in response to a signal given from the input terminal section 32 to the first signal transmission circuit 31. As a result, a voltage at the connection point JRB between the second and third resistors R2, R3 changes in accordance with a time change of a signal inputted from the input terminal section 32, so that a signal whose voltage level changes in accordance with the time change of the inputted signal is given to the processing circuit section 33. The first capacitor C1 functions for eliminating noise components of signals inputted from the input terminal section 32.

Placement of conductive patterns of the printed wiring board 35 of the first signal transmission circuit 31 and placement of a circuit device onto the printed wiring board 35 are predetermined at the time of designing on the assumption that a constitution for eliminating noise components of signals is added to a constitution for signal transmission. Therefore, a leading-side transmission path 41 in the input wiring 37 (referred to as 'first input wiring' hereafter) of the first embodiment is formed by only a conductive pattern 43. The leading-side transmission path 41 is, in the first input wiring 37, a portion from the connection point JCA between the first capacitor C1 for eliminating noise components and the first input wiring 37 to the connection point JST between the input terminal section 32 and the first input wiring 37, and constitutes a signal transmission path between the first capacitor C1 and the input terminal section 32. In a case where the leading-side transmission path 41 is constituted by only a conductive pattern, a through hole or a via hole does not exist in the leading-side transmission path 41, so that a resistance component of the leading-side transmission path 41 becomes the minimum value that is allowed on design. Thus, when the leading-side transmission path 41 does not have an extra resistance component, the first capacitor C1 for eliminating noise components effectively functions at all times. Consequently, in the first signal transmission circuit 31, the first capacitor C1 for eliminating noise components is capable of sufficiently eliminating noise components from signals transmitted in the first signal transmission circuit 31.

In the first embodiment, the printed wiring board 35 is realized by a double-sided printed wiring board. The double-sided printed wiring board has a constitution that conductive patterns are formed on only both faces of the board 38. In the double-sided printed wiring board, both a via hole and a through hole are cylindrical connecting portions that conductive metal is precipitated on inner wall faces of apertures formed on the insulation board, and central apertures thereof pierce the board 38 in the thickness direction. The diameter of the central aperture of the via hole is smaller than that of the through hole. The diameter of the central aperture of the via hole is less than 2 mm, in most cases, about 1 mm. Moreover, the diameter of the central aperture of the through hole is 2 mm or more. Hereafter, the through hole and the via hole will be referred to as 'connection holes' generically. It is preferable that the metal precipitated on the inner wall face of the aperture of the connection hole has a resistance value as low as possible, and the metal is realized by solder or copper, for example. One connection hole electrically connects two conductive patterns that are placed on both the faces of the board 38, respectively. The resistance value of one connection hole is larger than the resistance value of a conductive pattern of almost the same size with the connection hole. The reason is that the resistance value at a connecting portion between the connection hole and the conductive pattern is high, the pattern becomes long when meandered on both the faces of the board by the connection hole, and the resistance value becomes high as a result.

The printed wiring board 35 preferably includes, in the first input wiring 37, two or more conductive patterns 43 and one or more connection holes 44. The connection hole 44 is preferably placed on a terminating-side transmission path 42 in the first input wiring 37. The terminating-side transmission path 42 is, in the first input wiring 37, a portion from the connection point JCA between the first capacitor C1 and the first input wiring 37 to the connection point JTR between the transistor T1 and the first input wiring 37. In this constitution, it is possible to make a resistance component r of the terminating-side transmission path 42 in the first input wiring 37 larger than in a case where the terminating-side transmission path 42 is formed by only a conductive pattern. Therefore, the terminating-side transmission path 42 functions as a resistor that has the resistance component r, and the terminating-side transmission path 42 contributes to elimination of noise components of signals transmitted in the first signal transmission circuit 31.

In a case where the terminating-side transmission path 42 has a sufficiently high resistance component in this manner, not only the first capacitor C1, but also the terminating-side transmission path 42 serve for eliminating noise, so that noise components are sufficiently eliminated from signals transmitted in the first signal transmission circuit 31. It is preferable that the resistance value of the connection hole 44 in the terminating-side transmission path 42 is as high as possible. The connection hole with a large resistance value has a constitution that, for example, on the inner wall face of the aperture on the insulation board, instead of metal commonly used for the connection hole, a resistive element that has conductivity and has a larger resistance value than the metal is precipitated. In a case where the printed wiring board 35 of this constitution is used, when the connection hole is one, the first capacitor is placed on one face of the board 38, and the first resistor R1 and the transistor T1 are placed on the other face of the board 38. The one face of the board 38 may be a surface on a soldered side, or may be a surface on a side where parts are mounted.

As described above, in the first signal transmission circuit 31, the leading-side transmission path 41 in the first input wiring 37 is constituted by only a conductive pattern. In comparison with the signal transmission circuit of the related art, this first signal transmission circuit 31 is obtained by merely improving a wiring constitution of the printed wiring board 35 in order to eliminate noise components, and any printed part or any mounted part is not added. Consequently, the first signal transmission circuit 31 can have a higher capability of eliminating noise components than the signal transmission circuit of the related art without the necessity for more components than the signal transmission circuit of the related art. Therefore, the first signal transmission circuit 31 can have a higher capability of eliminating noise components without the need for an increased manufacturing cost as compared to the signal transmission circuit of the related art.

FIG. 5 is a plan view of a signal transmission circuit 51 (referred to as 'a second signal transmission circuit' hereafter), which is a second embodiment of the invention, and FIG. 6 is a sectional view taken on cross-sectional line VI—VI of FIG. 5. In a description of the second embodiment, of constitution elements of the second signal transmission circuit 51, constitution elements that have the same functions as those of the first signal transmission circuit 31 will be denoted by the same reference numerals as the constitution elements of the first embodiment, and a description thereof will be omitted. An equivalent circuit of the second signal transmission circuit 51 is equal to the equivalent circuit of the first signal transmission circuit 31 shown in FIG. 4.

The second signal transmission circuit 51 is, in electronic equipment, a circuit for transmitting signals from the input terminal section 32 to the processing circuit section 33, and comprises a constitution for eliminating noise components of signals. The second signal transmission circuit 51 comprises a printed wiring board 53, the transistor T1, the reference voltage source 36, the first resistor R1, the second resistor R2, the third resistor R3, and the first capacitor C1. The printed wiring board 53 includes input wiring 54 connected to the input terminal section 32, and the insulation board 38 where the input wiring 54 is formed.

Placement of conductive patterns of the printed wiring board 53 of the second signal transmission circuit 51 and placement of a circuit device onto the printed wiring board 53 are predetermined at the time of designing on the assumption that a constitution for eliminating noise components of signals is added to a constitution for signal transmission. Therefore, an intermediate transmission path 55 in the input wiring 54 (referred to as 'second input wiring' hereafter) of the second embodiment includes three or more conductive patterns 56 and two or more connection holes 57.

The intermediate transmission path 55 is, in the second input wiring 54, a portion from the connection point JCA between the first capacitor C1 and the second input wiring 54 to the connection point JRA between the first resistor R1 and the second input wiring 54. At least two of the conductive patterns 56 of the intermediate transmission path 55 are placed one by one on each face of the board 38. The two conductive patterns placed on the respective faces of the board 38 of the conductive patterns 56 of the intermediate transmission path 55 are electrically connected by one connection hole 57.

All the conductive patterns 56 of the intermediate transmission path 55 are sequentially connected by the connection holes 57, and form one transmission path. The intermediate transmission path 55 corresponds to part of a terminating-side transmission path, which is a signal transmission path between the first capacitor C1 for eliminating noise components of signals and the transistor T1 for transmitting signals.

As described above, in the second signal transmission circuit 51, two or more connection holes 57 are included in the intermediate transmission path 55 of the second input wiring 54. Consequently, the resistance component r of the intermediate transmission path 55 in the second input wiring 54 is larger than in a case where the intermediate transmission path 55 is constituted by only a conductive pattern. As a result, the intermediate transmission path 55 in the second input wiring 54 also functions as a resistor that has the resistance component r, and therefore, contributes to elimination of noise components of signals transmitted in the second signal transmission circuit 51. In a case where the intermediate transmission path 55 has a sufficiently high resistance component, not only the first capacitor C1, but also the intermediate transmission path 55 serve for eliminating noise, so that the second signal transmission circuit 51 is capable of sufficiently eliminating noise components from signals transmitted in the second signal transmission circuit 51.

It is preferable that the resistance values of the connection holes 57 in the intermediate transmission path 55 of the second input wiring are as large as possible. It is also preferable that the number of the connection holes 57 in the intermediate transmission path 55 is as many as possible. The connection hole 57 in the intermediate transmission path 55 may be dedicated for increasing a resistance component of the intermediate transmission path 55, and may also have a function as a connection hole for connecting another circuit device or another conductive pattern to the intermediate transmission path 55. The other circuit device is, for example, a capacitor for eliminating noise components other than the first capacitor.

As described above, in the second signal transmission circuit 51, the intermediate transmission path 55 of the second input wiring 54 is constituted only by two or more connection holes and conductive patterns. In comparison with the signal transmission circuit of the related art, the second signal transmission circuit of this constitution is obtained by merely improving a wiring constitution of the printed wiring board 53 in order to eliminate noise components, and any printed part or any mounted part is not added. Consequently, the second signal transmission circuit 51 can have a higher capability of eliminating noise components than the signal transmission circuit of the related art without the necessity for more components than the signal transmission circuit of the related art. Therefore, the second signal transmission circuit 51 can have a higher capability of eliminating noise components without the need for an increased manufacturing cost as compared to the signal transmission circuit of the related art.

In a case where the printed wiring board 53 of the above constitution is used, when the number of the connection holes 57 in the intermediate transmission path 55 of the second input wiring is an odd number, the first capacitor C1 is placed on one face of the board 38, and the first resistor R1 is placed on the other face of the board 38. In the above case, when the number of the connection holes is an even number, the first capacitor C1 and the first resistor R1 are placed on the one face of the board 38. The one face of the board 38 may be a surface on a soldered side, or may be a surface on a side where parts are mounted. Moreover, a leading-side transmission path 58 in the second input wiring 54 is, preferably, formed by only a conductive pattern. The leading-side transmission path 58 is, in the second input wiring 54, a portion from the connection point JCA between the first capacitor C1 and the second input wiring 54 to the connection point JST between the input terminal section 32 and the second input wiring 54. Consequently, noise components are further sufficiently eliminated from signals transmitted in the second signal transmission circuit 51.

Figure 7:
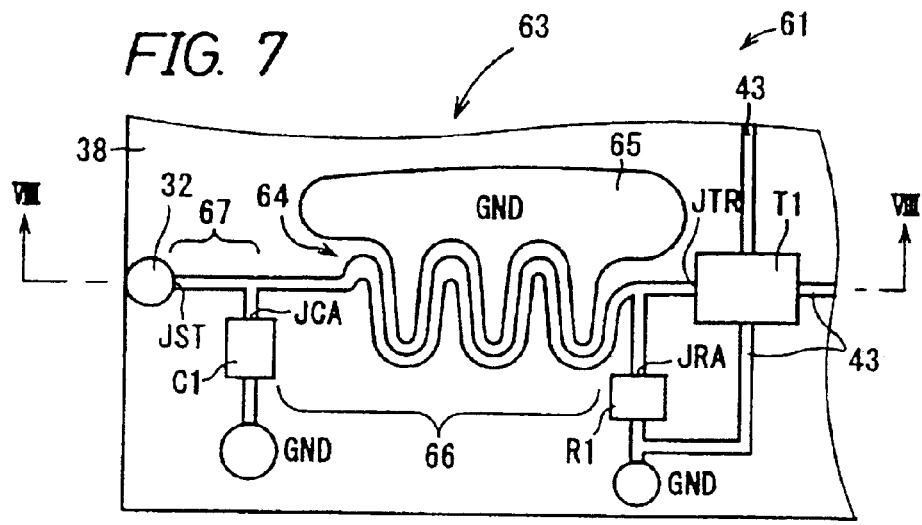
FIG. 7 is a plan view of part of a signal transmission circuit, which is a third embodiment of the invention.
Figure 8:
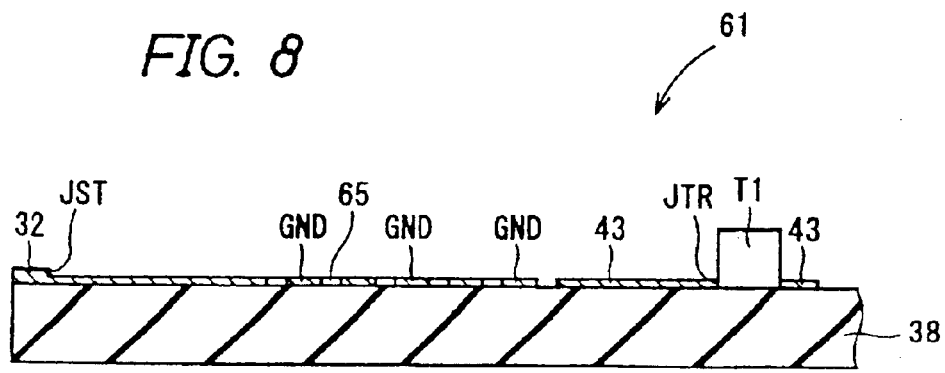
FIG. 8 is a sectional view taken on cross-sectional line VIII—VIII of FIG. 7.
Figure 9:
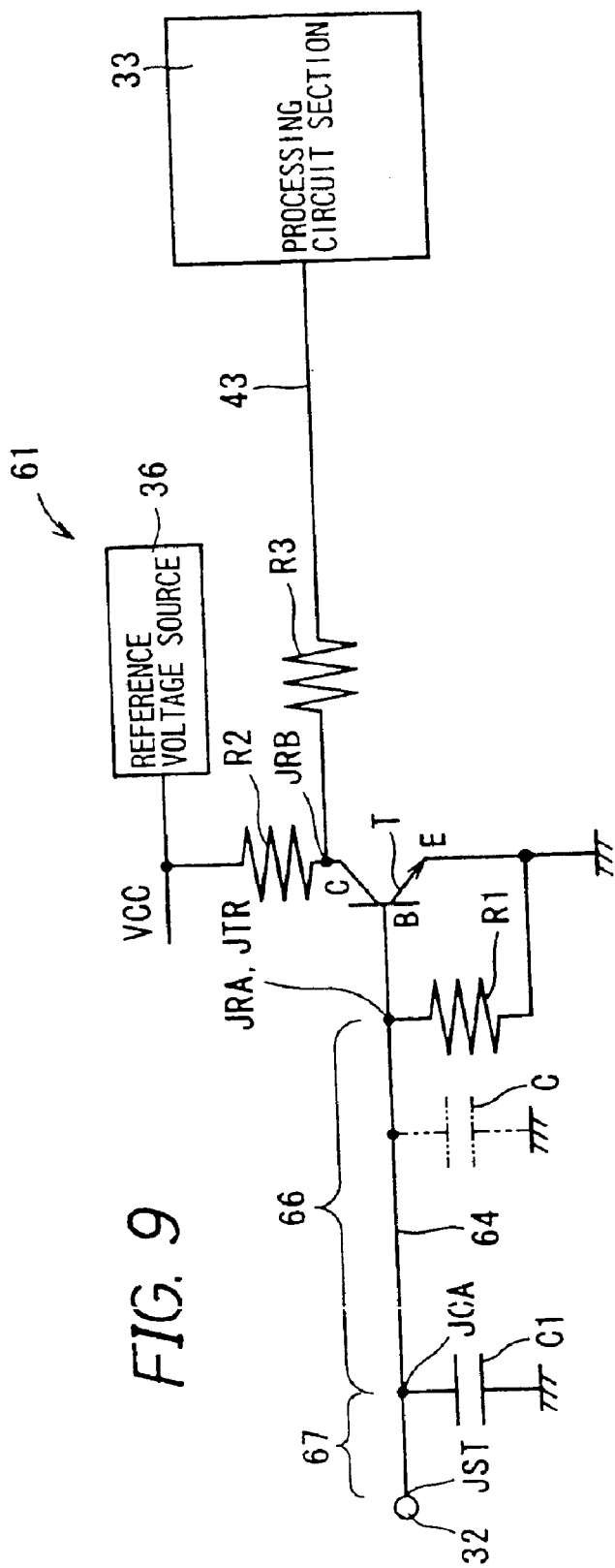
FIG. 9 is an equivalent circuit view of the signal transmission circuit of FIG. 7.

FIG. 7 is a plan view of part of a signal transmission circuit 61 (referred to as 'a third signal transmission circuit' hereafter), which is a third embodiment of the invention, FIG. 8 is a sectional view taken on cross-sectional line VIII—VIII of FIG. 7, and FIG. 9 is an equivalent circuit view of the third signal transmission circuit 61. In a description of the third embodiment, of constitution elements of the third signal transmission circuit 61, constitution elements that have the same functions as those of the first signal transmission circuit 31 will be denoted by the same reference numerals as the constitution elements of the first embodiment, and a description thereof will be omitted. The third signal transmission circuit 61 is, in electronic equipment, a circuit for transmitting signals from the input terminal section 32 to the processing circuit section 33, and comprises a constitution for eliminating noise components of signals.

The third signal transmission circuit 61 comprises a printed wiring board 63, the transistor T1, the reference voltage source 36, the first resistor R1, the second resistor R2, the third resistor R3, and the first capacitor C1. The printed wiring board 63 includes input wiring 64 connected to the input terminal section 32, grounding wiring 65 to be kept at a predetermined grounding potential, and the insulation board 38 where the input wiring 64 and the grounding wiring 65 are formed.

Placement of conductive patterns of the printed wiring board 63 of the third signal transmission circuit 61 and placement of a circuit device onto the printed wiring board 63 are predetermined at the time of designing on the assumption that a constitution for eliminating noise components of signals is added to a constitution for signal transmission. Therefore, an intermediate transmission path 66 in the input wiring 64 (referred to as 'third input wiring' hereafter) of the third embodiment is placed in the vicinity of the grounding wiring 65. The intermediate transmission path 66 is a portion of the third input wiring 64 from the connection point JCA between the first capacitor C1 and the third input wiring 64 to the connection point JRA between the first resistor R1 and the third input wiring 64.

In a case where the intermediate transmission path 66 in the third input wiring 64 exists in the vicinity of the grounding wiring 65, a parasitic capacitance c is generated between the intermediate transmission path 66 and the grounding wiring 65, so that the intermediate transmission path 66 and the grounding wiring 65 function as an electrode of the capacitor for eliminating noise components. As a result, in the third signal transmission circuit 61, the first capacitor C1 realized by a mounted part or a printed part and a capacitor using the wiring of the printed wiring board 64 eliminate noise components from signals, respectively. Consequently, the third signal transmission circuit 61 is capable of sufficiently eliminating noise components from signals transmitted in the signal transmission circuit 61. Thus, in the third signal transmission circuit 61, the intermediate transmission path 66 in the third input wiring 64 and the grounding wiring 65 serve for eliminating noise components of signals.

A space between the intermediate transmission path 66, in the third input wiring 64, and the grounding wiring 65 and a length of a section of the intermediate transmission path 66, in the input wiring 64, that keeps the space from the grounding wiring 65 are set, respectively, so that the parasitic capacitance c has a size to sufficiently eliminate noise components of signals. In order to further sufficiently eliminate noise components of signals, it is preferable that the intermediate transmission path 66 in the third input wiring 64 is curved. Consequently, it becomes possible to make a distance between the first capacitor C1 and the transistor T1 as short as possible while increasing a capability of eliminating noise components of signals that result from the intermediate transmission path 66. The intermediate transmission path 66 in the third input wiring 64 may be linear.

In comparison with the signal transmission circuit of the related art, the third signal transmission circuit 61 described above is obtained by merely improving the wiring constitution of the printed wiring board 64 in order to eliminate noise components, and any printed part or any mounted part is not added. Consequently, the third signal transmission circuit 61 can have a higher capability of eliminating noise components than the signal transmission circuit of the related art without the necessity for more components than the signal transmission circuit of the related art. Therefore, the third signal transmission circuit 61 can have a higher capability of eliminating noise components without the necessity for an increased manufacturing cost as compared to the signal transmission circuit of the related art.

Preferably, the intermediate transmission path 66 in the third input wiring 64 includes two or more connection holes, as well as the intermediate transmission path 55 of the second input wiring 54. Consequently, a capability of eliminating noise components of signals that result from the intermediate transmission path 66 further increases. Moreover, preferably, a leasing-side transmission path 67 in the third input wiring 64 is formed by only a conductive pattern, as well as the leading-side transmission path 41 in the first input wiring 37. Consequently, noise components are further sufficiently eliminated from signals transmitted in the third signal transmission circuit 61.

Figure 10:
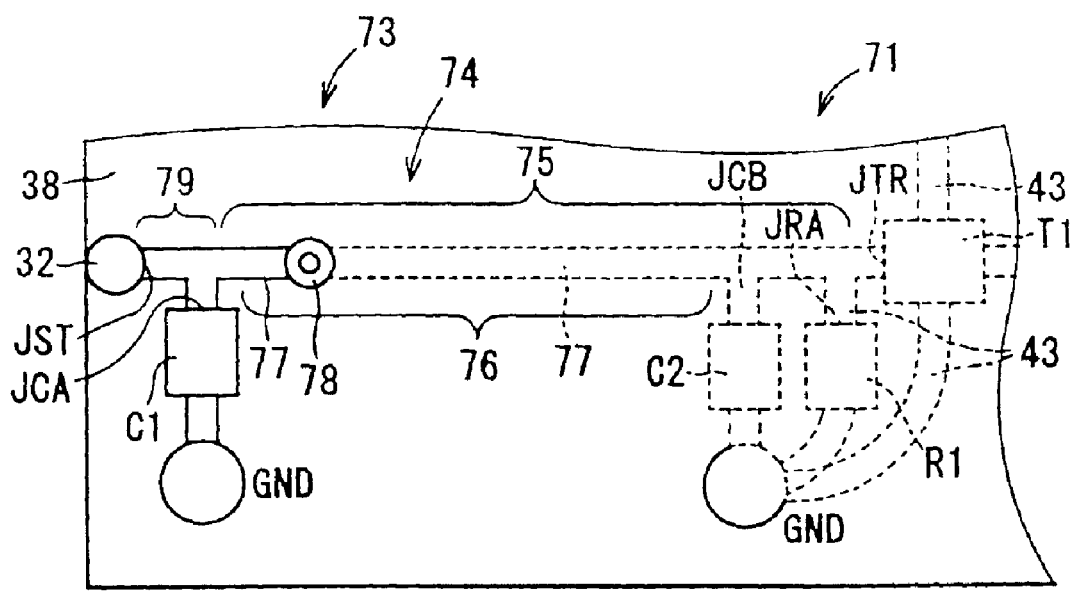
FIG. 10 is a plan view of part of a signal transmission circuit, which is a fourth embodiment of the invention.
Figure 11:
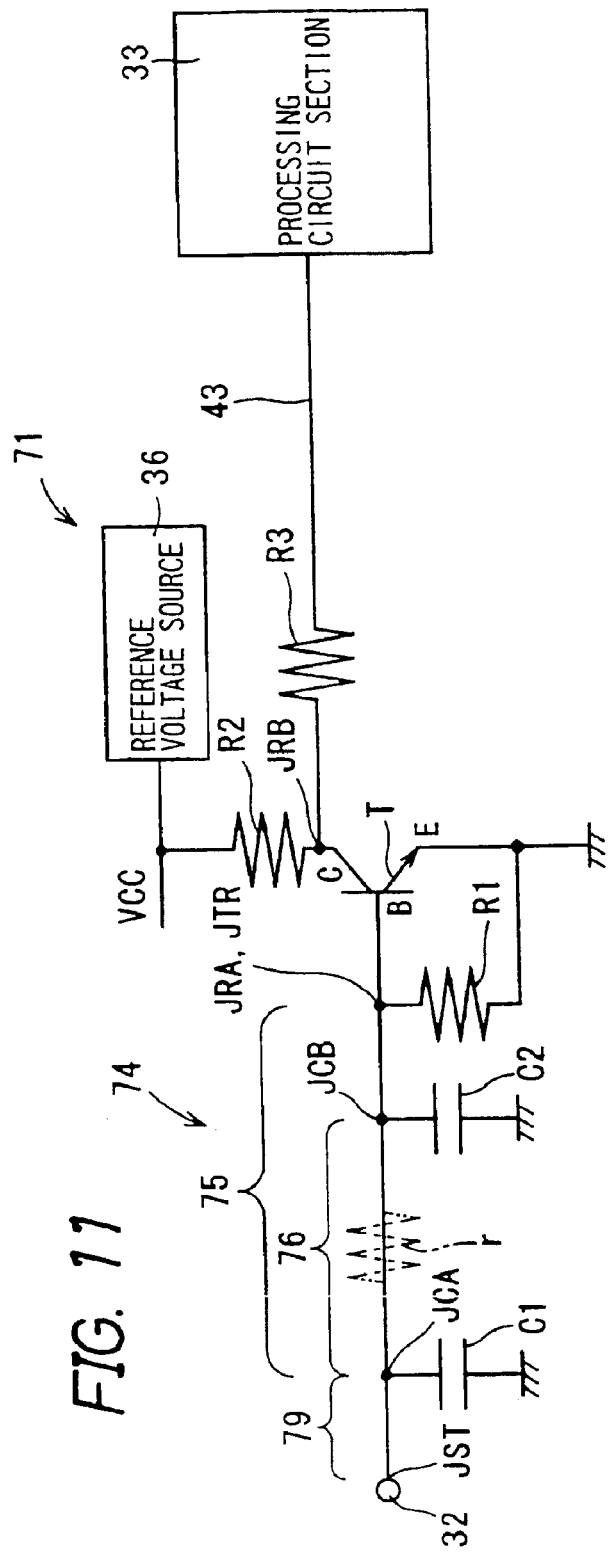
FIG. 11 is an equivalent circuit view of the signal transmission circuit of FIG. 6.
Figure 12:
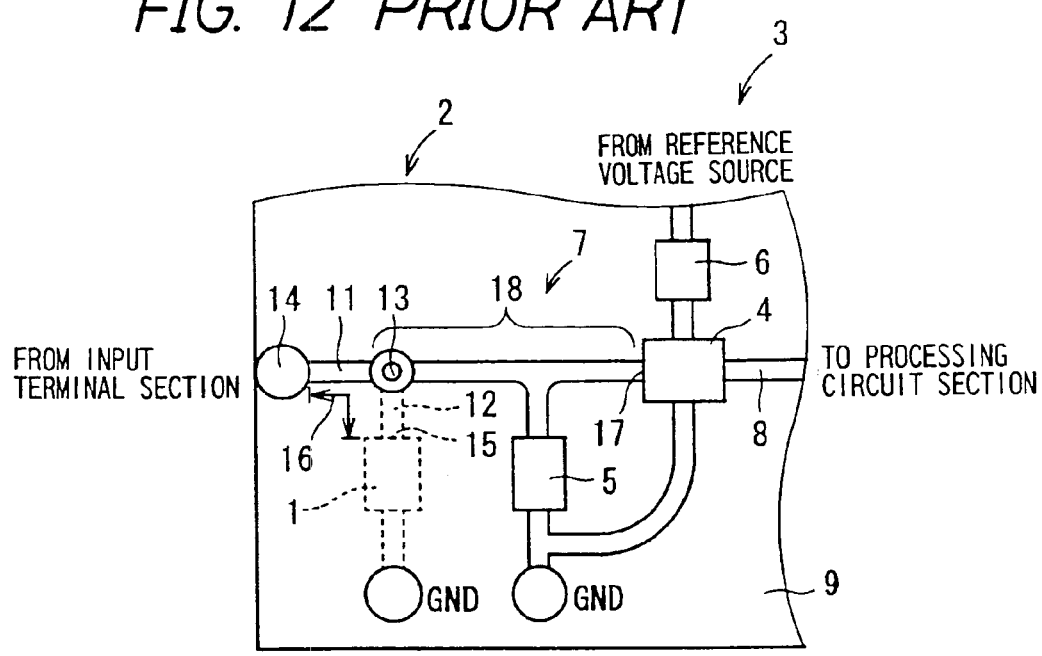
FIG. 12 is a plan view of part of a signal transmission circuit of a related art.

FIG. 10 is a plan view of a signal transmission circuit 71 (referred to as 'a fourth signal transmission circuit' hereafter), which is fourth embodiment of the invention, and FIG. 11 is an equivalent circuit view of the fourth signal transmission circuit. In a description of the fourth embodiment, of constitution elements of the fourth signal transmission circuit 71, constitution elements that have the same functions as those of the first signal transmission circuit 31 are denoted by the same reference numerals as the constitution elements of the first embodiment, and a description thereof will be omitted.

The fourth signal transmission circuit 71 is, in electronic equipment, a circuit for transmitting signals from the input terminal section 32 to the processing circuit section 33, and comprises a constitution for eliminating noise components of signals. The fourth signal transmission circuit 71 comprises a printed wiring board 73, the transistor T1, the reference voltage source 36, the first resistor R1, the second resistor R2, the third resistor R3, the first capacitor C1, and a second capacitor C2. The printed wiring board 73 includes input wiring 74 connected to the input terminal section 32, and the insulation board 38 where the input wiring 74 is formed.

One terminal of the second capacitor C2 is connected to an intermediate transmission path 75, which is a portion of the input wiring 74 from the connection point JCA with the first capacitor C1 to the connection point JRA with the first resistor R1. The other terminal of the second capacitor C2 is grounded. The connection point JCB between the second capacitor C2 and the input wiring 74 is closer to the connection point JTR between the transistor T1 and the input wiring 74 than the connection point JCA between the first capacitor C1 and the input wiring 74. In the input wiring 74, the connection point JCB with the second capacitor C2 exists in the vicinity of the connection point JTR with the transistor T1. The second capacitor C2 functions so as to eliminate noise components from signals transmitted in the signal transmission circuit 71.

Placement of conductive patterns of the printed wiring board 73 of the fourth signal transmission circuit 71 and placement of a circuit device onto the printed wiring board 73 are predetermined at the time of designing on the assumption that a constitution for eliminating noise components of signals is added to a constitution for signal transmission. Therefore, an inter-capacitance transmission path 76 in the input wiring 74 (referred to as 'fourth input wiring' hereafter) of the fourth embodiment includes two or more conductive patterns 77 that are placed on both the faces of the board 38, respectively, and one or more connection holes 78 that connect the conductive patterns placed on both the faces of the board. In the fourth input wiring 74, the inter-capacitance transmission path 76 is a portion from the connection point JCA between the first capacitor C1 and the fourth input wiring 74 to the connection point JCB between the second capacitor C2 and the fourth input wiring 74.

As described above, in the fourth signal transmission circuit 71, one or more through holes are included in the inter-capacitance transmission path 76 that exists between the two capacitors C1, C2 for eliminating noise components of signals. Consequently, the resistance component r of the inter-capacitance transmission path 76 becomes higher than that of a transmission path constituted by only a conductive pattern, so that the inter-capacitance transmission path 76 functions as a resistor. As a result, by the inter-capacitance transmission path 76 and the latter second capacitor C2, a low-pass filter is constituted. The second capacitor C2 is placed in the vicinity of the base terminal of the transistor T1. On the basis of the above reasons, noise components are prevented from being superposed on signals given to the base terminal of the transistor T1.

In a case where the inter-capacitance transmission path 76 has a sufficiently high resistance component r, in this manner, not only the first and second capacitors C1, C2, but also the inter-capacitance transmission path 76 serve for eliminating noise, so that it is possible to sufficiently eliminate noise components from signals transmitted in the fourth signal transmission circuit 71. Moreover, in this embodiment, the inter-capacitance transmission path 76 is constituted by only the connection hole 78 and the conductive patterns 77. In comparison with the signal transmission circuit of the related art, this signal transmission circuit 71 of the fourth embodiment is obtained by merely improving the wiring constitution of a printed wiring board in order to eliminate noise components, and any printed part or any mounted part is not added. Consequently, the signal transmission circuit 71 of the fourth embodiment can have a higher capability of eliminating noise components than the signal transmission circuit of the related art without the necessity for more components than the signal transmission circuit of the related art.

It is preferable that the resistance value of the connection hole 78 in the inter-capacitance transmission path 76 of the fourth input wiring 74 is as high as possible. It is also preferable that the number of the connection holes 78 in the inter-capacitance transmission path 76 is as many as possible. The connection hole 78 in the inter-capacitance transmission path 76 may be dedicated for increasing a resistance component of the inter-capacitance transmission path 76, and may be used for connecting another circuit device or another conductive pattern to the inter-capacitance transmission path 76. The other circuit device is, for example, a capacitor for eliminating noise components other than the first capacitor. Moreover, preferably, a leading-side transmission path 79 in the fourth input wiring 74 is formed by only a conductive pattern, as well as the leading-side transmission path 41 in the first input wiring 37. Consequently, noise components are further sufficiently eliminated from signals transmitted in the fourth signal transmission circuit 71.

The signal transmission circuits 31, 51, 61, 71 of the first to fourth embodiments described above are exemplifications of a signal transmission circuit of the invention, and as far as the aforementioned major constitution is the same, a signal transmission circuit of the invention can be realized in a variety of other manners. Specifically, the detailed constitution of each component of a signal transmission circuit may be realized by another constitution instead of the above constitution as far as the same effect can be obtained. A single signal transmission circuit may have two or more of the characteristics of the signal transmission circuits described respectively in the first to fourth embodiments. The more characteristics a single signal transmission circuit has, the more noise components the signal transmission circuit can eliminate from signals transmitted therein. The printed wiring board may have a constitution that three or more conductive layers are formed instead of a constitution that only two conductive layers are formed.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A signal transmission circuit for transmitting signals from an input terminal section to which the signals are inputted, to a processing circuit section in which the signals are processed, the signal transmission circuit comprising:

a printed wiring board including input wiring to be connected to the input terminal section and an insulation board on which the input wiring is formed; and a first capacitor, one terminal of the first capacitor being connected to the input wiring, wherein a connection point between the first capacitor and the input wiring is closer to a connection point between the input terminal section and the input wiring than a connection point between the processing circuit section and the input wiring, and a portion of the input wiring extending from the connection-point with the first capacitor to the connection point with the input terminal section is formed by only a conductive pattern.

2. A signal transmission circuit for transmitting signals from an input terminal section to which the signals are inputted, to a processing circuit section in which the signals are processed, the signal transmission circuit comprising:
   a printed wiring board including input wiring to be connected to the input terminal section and an insulation board on which the input wiring is formed;
   a transistor having a base terminal which is connected to the input wiring, an emitter terminal which is grounded, and a collector terminal which is to be connected to the processing circuit section;
   a reference voltage source for supplying a predetermined reference voltage to the collector terminal of the transistor;
   a resistor which is connected in parallel between the input wiring and the base terminal of the transistor, and the emitter terminal of the transistor; and
   a first capacitor, one terminal of the first capacitor being connected to the input wiring, wherein
   a portion of the input wiring extending from a connection point with the first capacitor to a connection point with the resistor includes three or more conductive patterns which are respectively placed on both faces of the printed wiring board and two or more through holes or via holes which connect the conductive patterns placed on both of the faces of the printed wiring board.

3. A signal transmission circuit for transmitting signals from an input terminal section to which the signals are inputted, to a processing circuit section in which the signals are processed, the signal transmission circuit comprising:
   a printed wiring board including input wiring to be connected to the input terminal section, wiring for grounding, and an insulation board on which the input wiring and the grounding wiring are formed;
   a transistor having a base terminal which is connected to the input wiring, an emitter terminal which is connected to the grounding wiring, and a collector terminal which is to be connected to the processing circuit section;
   a reference voltage source for supplying a predetermined reference voltage to the collector terminal of the transistor;
   a resistor which is connected in parallel between the input wiring and the base terminal of the transistor, and the emitter terminal of the transistor; and
   a first capacitor, one terminal of the first capacitor being connected to the input wiring, wherein
   a portion of the input wiring extending from a connection point with the first capacitor to a connection point with the resistor is parallel to and in a vicinity of the grounding wiring, and
   a parasitic capacitance is generated between the portion of the input wiring and the grounding wiring.

4. A signal transmission circuit of claim 3, wherein the portion of the input wiring extending from the connection point with the first capacitor to the connection point with the resistor is curved and meandering.

5. A signal transmission circuit for transmitting signals from an input terminal section to which the signals are inputted, to a processing circuit section in which the signals are processed, the signal transmission circuit comprising:
   a printed wiring board including input wiring to be connected to the input terminal section and an insulation board on which the input wiring is formed;
   a transistor having a base terminal which is connected to the input wiring, an emitter terminal which is grounded, and a collector terminal which is to be connected to the processing circuit section;
   a reference voltage source for supplying a predetermined reference voltage to the collector terminal of the transistor;
   a resistor which is connected in parallel between the input wiring and the base terminal of the transistor, and the emitter terminal of the transistor;
   a first capacitor, one terminal of the first capacitor being connected to the input wiring; and
   a second capacitor, one terminal of the second capacitor being connected to a portion of the input wiring extending from a connection point with the first capacitor to a connection point with the resistor, wherein
   a connection point between the second capacitor and the input wiring is closer to a connection point between the transistor and the input wiring than the connection point between the first capacitor and the input wiring, and
   a portion of the input wiring extending from the connection point with the first capacitor to the connection point with the second capacitor includes two or more conductive patterns which are respectively placed on both faces of the printed wiring board and one or more through holes or via holes which connect the conductive patterns placed on both of the faces of the printed wiring board.

6. An electronic device comprising:
   an input terminal section to which a signal is inputted;
   a processing circuit section in which a signal is processed; and
   a signal transmission circuit connecting the input terminal section and the processing circuit section, the signal transmission circuit comprising:
      a printed wiring board including input wiring connected to the input terminal section and an insulation board on which the input wiring is formed; and
      a first capacitor, one terminal of the first capacitor being connected to the input wiring, wherein
      a connection point between the first capacitor and the input wiring is closer to a connection point between the input terminal section and the input wiring than a connection point between the processing circuit section and the input wiring, and
      a portion of the input wiring extending from the connection point with the first capacitor to the connection point with the input terminal section is formed by only a conductive pattern.

7. An electronic device comprising:
   an input terminal section to which a signal is inputted; a processing circuit section in which a signal is processed; and
   a signal transmission circuit connecting the input terminal section and the processing circuit section, the signal transmission circuit comprising:
      a printed wiring board including input wiring connected to the input terminal section and an insulation board on which the input wiring is formed;
      a transistor having a base terminal which is connected to the input wiring, an emitter terminal which is grounded, and a collector terminal which is connected to the processing circuit section;

a reference voltage source for supplying a predetermined reference voltage to the collector terminal of the transistor;

a resistor which is connected in parallel between the input wiring and the base terminal of the transistor, and the emitter terminal of the transistor; and a first capacitor, one terminal of the first capacitor being connected to the input wiring, wherein a portion of the input wiring extending from a connection point with the first capacitor to a connection point with the resistor includes three or more conductive patterns which are respectively placed on both faces of the printed wiring board and two or more through holes or via holes which connect the conductive patterns placed on both of the faces of the printed wiring board.

8. An electronic device comprising:

an input terminal section to which a signal is inputted; a processing circuit section in which a signal is processed; and a signal transmission circuit connecting the input terminal section and the processing circuit section, the signal transmission circuit comprising:

a printed wiring board including input wiring connected to the input terminal section, wiring for grounding, and an insulation board on which the input wiring and the grounding wiring are formed;

a transistor having a base terminal which is connected to the input wiring, an emitter terminal which is connected to the grounding wiring, and a collector terminal which is connected to the processing circuit section;

a reference voltage source for supplying a predetermined reference voltage to the collector terminal of the transistor;

a resistor which is connected in parallel between the input wiring and the base terminal of the transistor, and the emitter terminal of the transistor; and a first capacitor, one terminal of the first capacitor being connected to the input wiring, wherein a portion of the input wiring extending from a connection point with the first capacitor to a connection point with the resistor is parallel to and in a vicinity of the grounding wiring, and a parasitic capacitance is generated between the portion of the input wiring and the grounding wiring.

9. A electronic device of claim 8, wherein the portion of the input wiring extending from the connection point with the first capacitor to the connection point with the resistor is curved and meandering.

10. An electronic device comprising:

an input terminal section to which a signal is inputted;

a processing circuit section in which a signal is processed; and a signal transmission circuit connecting the input terminal section and the processing circuit section, the signal transmission circuit comprising:

a printed wiring board including input wiring connected to the input terminal section and an insulation board on which the input wiring is formed;

a transistor having a base terminal which is connected to the input wiring, an emitter terminal which is grounded, and a collector terminal which is connected to the processing circuit section;

a reference voltage source for supplying a predetermined reference voltage to the collector terminal of the transistor;

a resistor which is connected in parallel between the input wiring and the base terminal of the transistor, and the emitter terminal of the transistor;

a first capacitor, one terminal of the first capacitor being connected to the input wiring; and a second capacitor, one terminal of the second capacitor being connected to a portion of the input wiring extending from a connection point with the first capacitor to a connection point with the resistor, wherein a connection point between the second capacitor and the input wiring is closer to a connection point between the transistor and the input wiring than the connection point between the first capacitor and the input wiring, and a portion of the input wiring extending from the connection point with the first capacitor to the connection point with the second capacitor includes two or more conductive patterns which are respectively placed on both faces of the printed wiring board and one or more through holes or via holes which connect the conductive patterns placed on both of the faces of the printed wiring board.

* * * * *